United States Patent [19]

Todokoro

[11] 4,000,474
[45] Dec. 28, 1976

[54] SIGNAL AMPLIFIER CIRCUIT USING A FIELD EFFECT TRANSISTOR HAVING CURRENT UNSATURATED TRIODE VACUUM TUBE CHARACTERISTICS

[75] Inventor: Shigeru Todokoro, Fujisawa, Japan

[73] Assignee: Tokyo Shibaura Electric Co., Ltd., Kawasaki, Japan

[22] Filed: June 10, 1975

[21] Appl. No.: 585,596

[30] Foreign Application Priority Data

June 19, 1974 Japan .............................. 49-69100

[52] U.S. Cl. .................................... 330/35; 330/13; 330/17; 330/18; 330/19; 330/22; 330/149; 330/156

[51] Int. Cl.[2] ............................................ H03F 3/16

[58] Field of Search ............... 330/13, 15, 17, 22, 330/18, 19, 35, 40, 149, 156; 328/176

[56] References Cited

UNITED STATES PATENTS

| 3,504,293 | 3/1970 | Lin | 330/35 |
|---|---|---|---|
| 3,828,230 | 8/1974 | Nishizawa et al. | 357/22 |
| 3,862,367 | 1/1975 | Kono et al. | 330/13 X |
| 3,898,576 | 8/1975 | Fukaya | 330/30 D X |

OTHER PUBLICATIONS

Towers, "High Input-Impedance Amplifier Circuits", *Wireless World*, July 1968, pp. 197–200.

Primary Examiner—James B. Mullins
Attorney, Agent, or Firm—Oblon, Fisher, Spivak, McClelland & Maier

[57] ABSTRACT

A bootstrap driver circuit directly coupled to a complementary pushpull output circuit and including a field effect transistor with current unsaturated triode vacuum tube characteristics. The output of the pushpull output circuit is coupled to the drain and source circuits of the driver field effect transistor by means of capacitors. The present invention also discloses a pre-driver circuit which uses a current unsaturated type field effect transistor and can be directly coupled to the driver circuit.

8 Claims, 5 Drawing Figures

SIGNAL AMPLIFIER CIRCUIT USING A FIELD EFFECT TRANSISTOR HAVING CURRENT UNSATURATED TRIODE VACUUM TUBE CHARACTERISTICS

BACKGROUND OF THE INVENTION

This invention relates to a signal amplifier circuit and more particularly to a signal amplifier circuit utilizing a field effect transistor having current unsaturated triode vacuum tube characteristics.

Recently, a field effect transistor having current unsaturated characteristics like those of a triode vacuum tube disclosed in U.S. Pat. No. 3,828,230 issued to Nishizawa et al. on Aug. 6, 1974 (the corresponding Japanese patent application was laid open on Mar. 30, 1973) has attracted attention as an active amplifying element for an audio signal amplifier circuit.

A field effect transistor and bipolar transistor hitherto used as active amplifying elements have current saturated characteristics like a pentode vacuum tube. The aforesaid new field effect transistor excells over these old amplifying elements in respect of output power, linearity and frequency characteristics.

The fact that an amplifying element has triode vacuum tube characteristics, means that the operating current of the amplifying element varies not only with an input signal, but also with variation in direct-current supply voltage. Where, therefore, it is attempted to design a direct-coupled signal amplifier circuit using a current unsaturated type amplifying element, then same kind of the conventional direct-coupled amplifier circuit using a current saturated type amplifying element can not be applied in the original configuration.

A true-complementary or quasi-complementary pushpull circuit has been widely used as an output stage for an audio signal amplifier. As a driver circuit to drive the complementary pushpull circuit is known a bootstrap driver circuit. Where a new current unsaturated type field effect transistor is used as an active amplifying element of the bootstrap driver circuit, then a gain in the driver stage prominently falls due to an output signal from the pushpull circuit being superposed on direct-current operating voltage supplied to the driver stage, failing to drive fully the pushpull circuit.

SUMMARY OF THE INVENTION

It is accordingly an object of this invention to provide an improved semiconductor audio signal amplifier circuit using a current unsaturated type field effect transistor.

Another object of the invention is to provide a bootstrap driver circuit which can be coupled directly to a pushpull output circuit even when a current unsaturated type field effect transistor is used.

Still another object of the invention is to provide a predriver circuit using a single current unsaturated type field effect transistor which can be coupled directly to a driver circuit.

According to an embodiment of this invention, a first resistor (load) connected to the drain electrode of a current unsaturated type driver field effect transistor and the source electrode of the transistor are connected to power supply means connected to a semiconductor pushpull circuit through second and third resistors respectively. An output of the pushpull circuit is coupled to a first point between the first and second resistors and a second point between the source of the current unsaturated type driver field effect transistor and the third resistor by means of capacitors.

Namely, the output signal is supplied from the pushpull circuit to the first and second points, thereby fixing D.C. potential difference between the first and second points. Accordingly, the current unsaturated type driver field effect transistor can fully drive the pushpull circuit in response to an input signal along without being affected by the feedback of an output signal from the pushpull circuit.

With the predriver circuit of this invention using a single current unsaturated type field effect transistor which can be coupled directly to the driver circuit, the drain electrode of the predriver field effect transistor is directly coupled to the gate electrode of the driver field effect transistor and also connected to the aforesaid second point through a fourth resistor. The source electrode of the predriver field effect transistor is connected to the power supply means through a fifth resistor and also to the second point through a sixth resistor. The predriver field effect transistor can obtain a full gain without being affected by voltage variation at the second point by setting the resistance of the fifth and sixth resistors at selected values, thereby rendering the driver field effect transistor fully operative. With the selected resistance values of the fifth and sixth resistors expressed by the following equation:

$$R_6 = \mu R_5$$

(where $\mu$ is an amplification factor of the current unsaturated type predriver field effect transistor), then the predriver circuit becomes utterly non-responsive to variation in the operating voltage for the predriver field effect transistor.

DETAILED DESCRIPTION OF THE PREFERRED EMBODIMENTS

Figure 1:
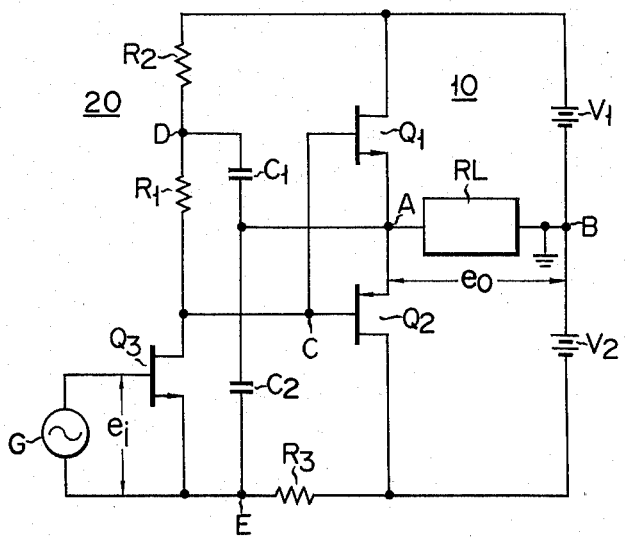
FIG. 1 is a schematic illustration of a signal amplifier circuit embodying this invention.

FIG. 1 shows a two power source-system signal amplifier circuit comprising a true-complementary pushpull output circuit 10 and driver circuit 20. In the pushpull output circuit 10, the source electrodes of an n-channel type field effect transistor $Q_1$ and p-channel type field effect transistor $Q_2$ are connected to a common output point A. Connected between the output point A and ground point B is a load impedance RL such as the voice coil of a loudspeaker. Power sources $V_1$, $V_2$ are connected between the drain electrode of the transistor $Q_1$ and ground point B and between the drain electrode of the transistor $Q_2$ and ground point B respectively with the indicated polarity. The gate electrodes of the transistors $Q_1$, $Q_2$ are jointly connected to an input point C.

The driver circuit 20 comprises an n-channel type field effect transistor $Q_3$, the drain electrode of which is connected to the first or load resistor $R_1$. This load resistor $R_1$ is connected to the drain electrode of the first output transistor $Q_1$ and the positive terminal of the power source $V_1$ through a second resistor $R_2$. The source electrode of the driver transistor $Q_3$ is connected to the drain electrode of the second output transistor $Q_2$ and the negative terminal of the power source $V_2$ through a third resistor $R_3$. The drain electrode or output terminal of the driver resistor $Q_3$ is directly coupled to the input point C of the output circuit 10 without passing through a D.C. blocking capacitor, that is, in a direct-current conducting manner. Connected between the gate and source electrodes of the driver transistor $Q_3$ is an input signal source G. As this signal source G which supplies an input signal between the gate and source electrodes of the driver transistor $Q_3$ is usually used a predriver circuit. A first capacitor $C_1$ is connected between the output point A and the first point D which is positioned between the first and second resistors $R_1$, $R_2$. A second capacitor $C_2$ is connected between the output point A and the second point E which is disposed between the source electrode of the driver transistor $Q_3$ and third resistor $R_3$. Both capacitors $C_1$, $C_2$ are selected to such a value as provide considerably low impedance to audio frequencies.

As compared with the prior art signal amplifier circuit, the signal amplifier circuit according to this invention shown in FIG. 1 is novel and unique in that the signal amplifier circuit of the invention is further provided with the second capacitor $C_2$ and third resistor $R_3$. These second capacitor $C_2$ and third resistor $R_3$ are provided particularly for operation of the driver transistor $Q_3$. With the signal amplifier circuit of this invention shown in FIG. 1 whose output circuit 10 has the same arrangement as that of the prior art, it is preferred to use new current unsaturated type field effect transistors as the output transistors $Q_1$ and $Q_2$. However, the output transistors $Q_1$, $Q_2$ are not limited to the new current unsaturated type field effect transistors, but may consist of the conventional current saturated type field effect transistors or bipolar transistors. Though FIG. 1 indicates a two power source-system true-complementary pushpull output circuit 10, yet it is possible to replace the output circuit by a single power source-system true-complementary pushpull output circuit or a single or two power source-system quasi-complementary pushpull output circuit.

Now let us study the prior art bootstrap driver circuit wherein only the point D is connected to the output point A through a low impedance capacitor $C_1$, before describing the operation of a driver circuit using current unsaturated type driver field effect transistors according to this invention. Since the point D is connected to the output point A through the low impedance capacitor $C_1$, voltage at the point D becomes a power source voltage for operation of the driver transistor $Q_3$. At this point D, therefore, direct current voltage of fixed level and a signal fed back from the output circuit 10 are superposed on each other. In this case, the supply voltage impressed on the driver transistor $Q_3$ varies with the output signal from the output circuit 10. Where the driver transistor $Q_3$ consists of a conventional field effect transistor or bipolar transistor having current saturated pentode vacuum tube characteristics, the operating current of the driver transistor $Q_3$ does not respond to variation in the supply voltage caused by the output signal fed back to the point D from the output circuit 10, but only responds to an input signal applied between the gate and source electrodes or between the base and emitter electrodes of the driver transistor $Q_3$, thereby enabling the driver transistor $Q_3$ to have a predetermined amplification.

There will now be described the operation of a driver circuit wherein the driver transistor $Q_3$ consists of a current unsaturated type field effect transistor.

Figure 2:
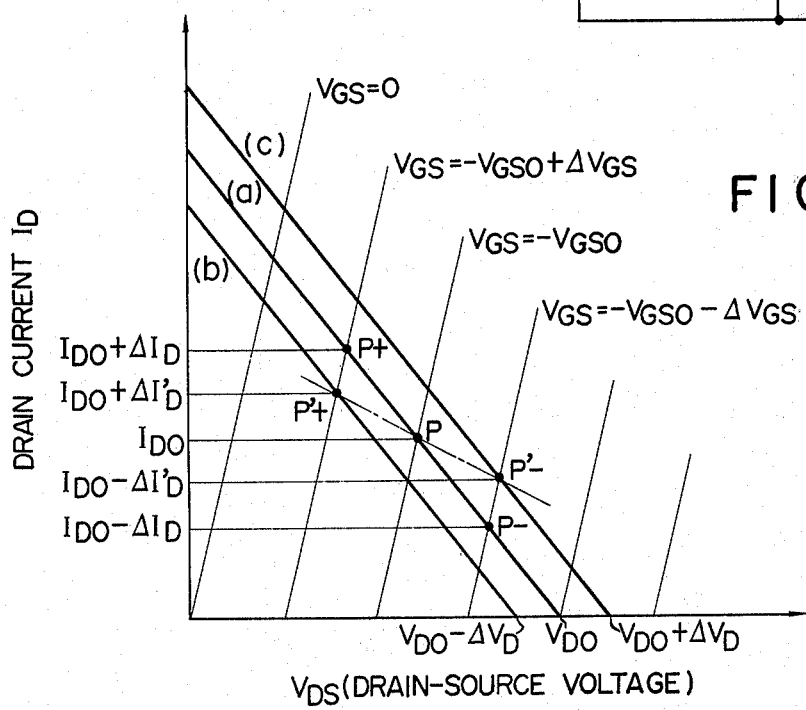
FIG. 2 schematically illustrates the drain current to drain-to-source voltage characteristics of an n-channel type field effect transistor having current unsaturated triode vacuum tube characteristics.

The drain current $I_D$ of a field effect transistor having current unsaturated triode vacuum tube characteristics may be expressed approximately by the following equation as in the case of a triode vacuum tube:

$$I_D = gm \left( V_{GS} + \frac{V_{DS}}{\mu} \right) \quad (1)$$

where
$V_{GS}$ = gate-to-source voltage
$V_{DS}$ = drain-to-source voltage
$\mu$ = voltage amplification factor
$gm$ = mutual conductance Namely, the drain current $I_D$ varies, as shown in FIG. 2, almost linearly relative to $V_{DS}$ with $V_{GS}$ taken as a parameter. Substantially parallel straight lines (a), (b), and (c) in FIG. 2 denote the load lines of the driver transistor $Q_3$ under different conditions. The gradients of these load lines correspond to the load resistor $R_1$. The central load line (a) shows the case where direct-current voltage at the junction point D of the resistors $R_1$, $R_2$ of FIG. 1 is fixed at $V_{DO}$. For example, where the gate of the driver transistor $Q_3$ is biased to $-V_{GSO}$ volts relative to the source thereof, then the operating point of the transistor $Q_3$ stands at the point P on the central load line (a). At this time, the drain current is represented by $I_{DO}$.

Since $$I_{DO} = gm \left( -V_{GSO} + \frac{V_{DO} - I_{DO}R_1}{\mu} \right),$$

the following equation results:

$$I_{DO} = \frac{\mu(-V_{GSO}) + V_{DO}}{r_p + R_1} \quad (2)$$

where $r_p = \mu/gm$ denotes the internal resistance of the driver transistor $Q_3$. Where $V_{DO}$ is fixed, the operating point of the driver transistor $Q_3$ is shifted between a point $P_+$ and a point $P_-$ on the central load line (a) with the point P taken as the center according to an alternating current signal component $\pm\Delta V_{GS}$ superposed on the bias voltage $-V_{GSO}$. In this case, the drain current increases by $+\Delta I_D$ during the positive half cycles of an input signal and decreases by $-\Delta I_D$ during the negative half cycles of the input signal.

There will now be described the case where an output signal from the output circuit 10 is fed back to only the point D. As seen from FIG. 1, a driver input signal ei supplied to the driver transistor $Q_3$ has an opposite phase to an output signal eo developed across the load RL. Where, therefore, the gate voltage increases by $\Delta V_{GS}$ during the positive half cycles of the input signal applied to the driver transistor $Q_3$, then an output signal eo falls accordingly, leading to a decrease in the voltage at the point D. As the result, the drain current $I_D$ is more decreased than when the abovementioned output signal is not fed back to the point D. Thus the operating point of the field effect transistor is moved to the point $P_+'$ on the lower load line (b) for the lower supply voltage than $V_{DO}$. Conversely during the negative half cycles of the input signal supplied to the driver transistor $Q_3$, the voltage at the point D rises with the resultant increase in the drain current. At this time, the operating point of the driver transistor $Q_3$ is shifted to the point $P_-'$ on the upper load line (c) for the higher supply voltage than $V_{DO}$. Namely, if affected by the feedback of the aforesaid output signal, the driver transistor $Q_3$ indicates such an operating point as is transferred between the point $P_+'$ on the lower load line (b) and the point $P_-'$ on the upper load line (c) with the point P on the central load line (a) taken as the center. An amount of variation $\Delta I_D'$ occurring in the drain current $I_D$ at this time is smaller than $\Delta I_D$ and may be expressed by the following equation:

$$\Delta I_D' = \frac{\mu \Delta V_{GS} - \Delta V_D}{r_p + R_1} \qquad (3)$$

where $\Delta V_D$ denotes an output signal component which is fed back from the output circuit 10 to the point D.

The above-mentioned variation of the drain current resulting from that of the supply voltage prominently reduces a gain of the driver transistor $Q_3$. Namely, with a voltage gain in the output circuit 10 designated as G, the above-mentioned voltage gain in the driver transistor $Q_3$ falls to 1/1+G as compared with the case where an output signal from the output circuit 10 is not fed back to the point D. The overall gain in the driver circuit and output circuit 10 becomes smaller than a gain in the driver circuit when an output signal from the output circuit 10 is not superposed on the voltage impressed on the point D. This means that where a new current unsaturated type field effect transistor is used in the prior art bootstrap driver circuit, a gain in the output stage will fall to a lower level than unity.

With a signal amplifier circuit according to the embodiment of this invention shown in FIG. 1, which includes the capacitor $C_2$ coupling the output point A to the source electrode of the driver transistor $Q_3$ of current unsaturated triode vacuum type, an output voltage from the output circuit 10 is superposed on the voltages impressed on both drain and source electrodes of the driver transistor $Q_3$. As the result, voltages at points D and E vary in the same degree and direction, thus cancelling the voltage variations at the points D and E. This is equivalent to the case where an output voltage from the output circuit 10 is not superposed on the supply voltage impressed on the driver transistor $Q_3$. Therefore, the operating current of the driver transistor $Q_3$ solely depends on the voltage of an input signal, preventing a voltage gain in the driver transistor $Q_3$ from being decreased. Since the voltage across the points D and E is kept at a fixed level by the capacitors $C_1$, $C_2$, a driver output signal having a sufficient amplitude is obtained within the range of good linearity, thus enabling the output transistors $Q_1$, $Q_2$ to be driven alternately into saturation.

Referring to FIG. 1, either the first capacitor $C_1$ or the second capacitor $C_2$ may be connected between the points D, E.

Figure 3:
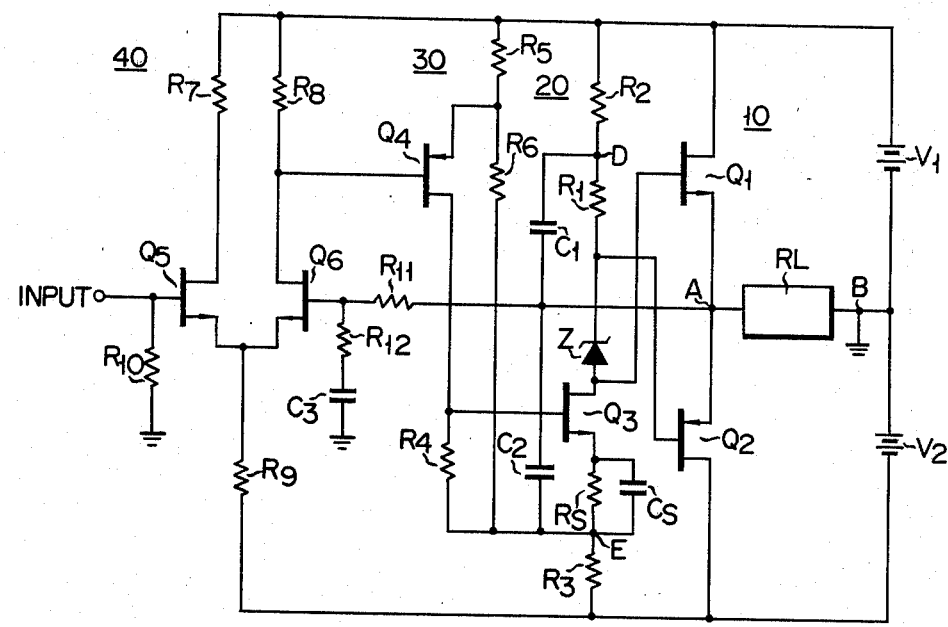
FIG. 3 indicates the schematic circuit diagram of a signal amplifier circuit according to another embodiment of the invention which includes bias circuits, predriver circuit and input circuit.

FIG. 3 shows a signal amplifier circuit according to another embodiment of this invention which includes a predriver circuit 30 which can be coupled directly to the driver circuit 20. The parts of FIG. 3 the same as those of FIG. 1 are denoted by the same numerals, description thereof being omitted. A predriver circuit which uses a current unsaturated type field effect transistor and yet can be coupled directly to the driver circuit 20 should be the type free from the effect of the voltage variation which occurs at the source electrode of the driver transistor $Q_3$ included in the driver circuit 20 due to an output voltage from the output circuit 10 being superposed on the voltage impressed on the source electrode of the driver transistor $Q_3$. The embodiment of FIG. 3 is provided with a predriver circuit 30 according to this invention, which meets the above-mentioned requirement.

The drain electrode of a current unsaturated type p-channel field effect transistor $Q_4$ included in the predriver circuit 30 is connected to the point E through a load resistor $R_4$. The source electrode of the transistor $Q_4$ is connected to the positive terminal of the power source $V_1$ through a resistor $R_5$. A resistor $R_6$ is connected between the source electrode of the transistor $Q_4$ and the point E. The drain electrode of the transistor $Q_4$ is directly coupled to the gate of the driver transistor $Q_3$.

The referential numeral 40 represents an input stage comprising n channel type field effect transistors $Q_5$, $Q_6$ connected in common source configuration. The drain electrodes of the transistors $Q_5$, $Q_6$ are connected to the positive terminal of the power source $V_1$ through the corresponding resistors $R_7$, $R_8$. The jointly connected source electrodes of the transistors $Q_5$, $Q_6$ are connected to the negative terminal of the power source $V_2$ through a resistor $R_9$. The gate electrode of the transistor $Q_5$ is grounded through a resistor $R_{10}$ and is connected to receive an input signal. The gate of the transistor $Q_6$ is connected to the output point A through a resistor $R_{11}$ and is also grounded through a series circuit of a resistor $R_{12}$ and capacitor $C_3$. The drain electrode of the transistor $Q_6$ is directly coupled to the gate electrode of the predriver transistor $Q_4$. Connected between the drain electrode of the driver transistor $Q_3$ and load resistor $R_1$ is a Zener diode to provide a predetermined level of voltage between the gate electrodes of the transistors $Q_1$, $Q_2$ for Class B operation. The Zener diode Z may be replaced by another constant voltage element or a constant voltage circuit including a constant voltage element or elements.

A self-bias circuit consisting of a resistor $R_S$ and capacitor $C_S$ is connected between the source electrode of the driver transistor $Q_3$ and the resistor $R_3$ so as to negatively bias the gate electrode of the transistor $Q_3$ relative to the source electrode thereof.

Figure 4:
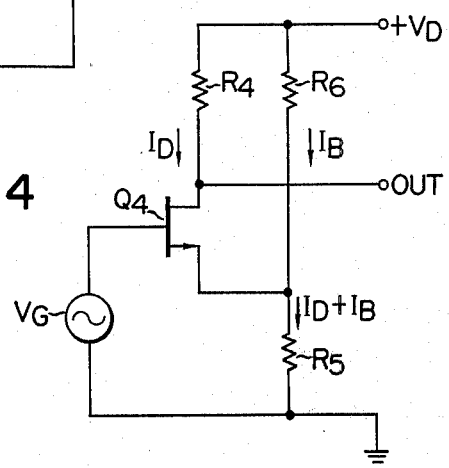
FIG. 4 illustrates the circuit diagram of the predriver circuit of FIG. 3 to explain the operation of the same.

There will now be described by reference to FIG. 4 the operation of the predriver circuit 30. The circuit 30 is connected between the $+V_D$ supply terminal and ground and employs an n-channel field effect transistor.

With currents flowing through resistors $R_4$, $R_6$ denoted by $I_D$, $I_B$ respectively, the gate-to-source voltage $V_{GS}$ of the transistor $Q_4$ may be expressed as follows:

$$V_{GS} = V_G - R_5(I_D + I_R) \quad \quad 4.$$

The drain-to-source voltage $V_{DS}$ is expressed as follows:
$$V_{DS} = V_D - I_D R_4 - (I_D + I_R) R_5 \quad \quad 5.$$

$I_R$ is given as follows:
$$I_R = \frac{V_D - I_D R_5}{R_5 + R_6} \quad \quad (6)$$

Where the above equations (4), (5), (6) are substituted in the equation (1), $I_D$ may be given as follows:

$$I_D = \frac{\mu V_G + \dfrac{(R_6 - \mu R_5)}{R_6 + R_5} \cdot V_D}{r_p + R_4 + (\mu+1)\dfrac{R_6 \cdot R_5}{R_6 + R_5}} \quad \quad (7)$$

If, therefore, $R_6$, $R_5$ are chosen to have such values as satisfy the equation $R_6 = \mu R_5$ within the range of permitting the establishment of the above (4), (5), (6), then the drain current $I_D$ of the transistor $Q_4$ will have a value independent of that of $V_D$. As the result, $I_D$ obviously varies with an input signal alone without being affected by changes in the supply voltage $V_D$. This is due to the fact that variation in the supply voltage $V_D$ which is transmitted to the drain electrode of the transistor $Q_4$ to increase its operating current is also transmitted to the source electrode thereof through the resistor $R_6$ to decrease the operating current of transistor $Q_4$ and vice versa. In case of $R_6 = \mu R_5$, increase and decrease in the operating current of transistor $Q_4$ are balanced, rendering the operating current insensitive to variation in the supply voltage $V_D$.

Accordingly, the predriver circuit 30 of FIG. 3 including the predriver transistor $Q_4$ whose source and drain electrodes are direct-current conductively connected to the source electrode of the driver transistor $Q_3$ through the corresponding resistors $R_6$, $R_5$ becomes insensitive to that variation in the voltage at the source electrode of the driver transistor $Q_3$ which is caused by superposition of output voltage from the output circuit 10 on the point E. Therefore, though including a current unsaturated type field effect transistor, the predriver circuit 30 of FIG. 3 can be, as easily understood, directly coupled to the driver circuit 20.

Where, in FIG. 3, the resistor $R_6$ is omitted, the signal current flowing through the predriver transistor $Q_4$ is affected by the overall gain of the driver circuit 20 and output circuit 10, probably causing oscillation. However, with the predriver circuit 30 provided with the resistor $R_6$ according to this invention, the relationship of $R_6 = \mu R_5$ renders A.C. current flowing through the transistor $Q_4$ free from the effect of the overall gain of the driver circuit 20 and output circuit 10 and consequently eliminates possibility of the oscillation. The relationship of $R_6 = \mu R_5$ need not be rigid but has only to be such as reduces the effect of supply voltage variation on the transistor $Q_4$ and the possibility of causing the above-mentioned oscillation. The resistor $R_6$ need not be connected to the point E like the resistor $R_4$, but may be connected to a point at which voltage varies with the same phase as the point E, for example, the output point A which is coupled to the source electrode of the driver transistor $Q_3$.

Referring again to FIG. 3, the resistor $R_{10}$ connecting the gate electrode of the transistor $Q_5$ included in the input stage or differential amplifier 40 to ground is provided to establish the gate electrode of the transistor $Q_5$ to ground potential. To the gate electrode of the other transistor $Q_6$ in the input stage 40 is coupled the output of the pushpull output circuit 10 through a signal and direct-current feedback network including resistors $R_{11}$, $R_{12}$ and capacitor $C_3$ to provide a negative feedback to the input stage. The negative feedback from the output stage 10 to the input stage 40 by means of the resistor $R_{11}$ establishes the output point A at ground potential.

Figure 5:
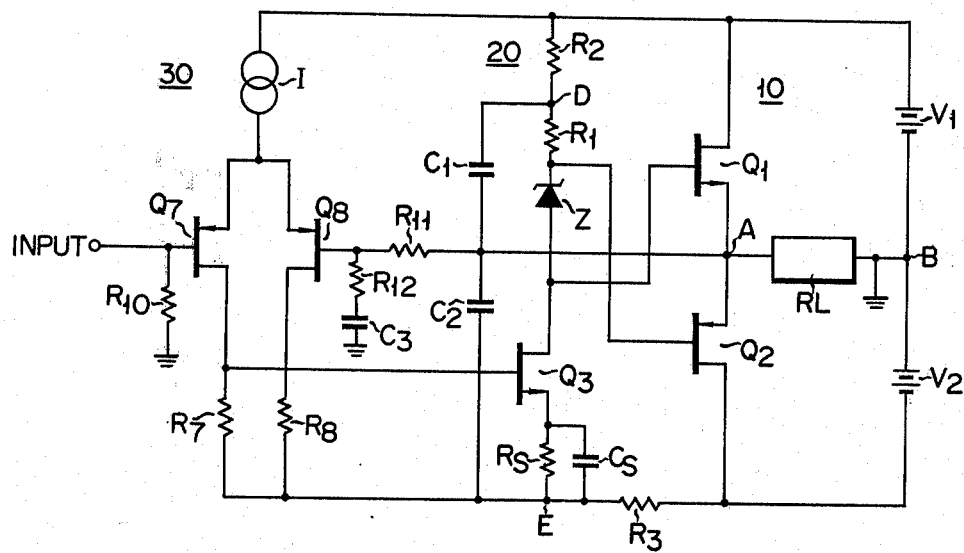
FIG. 5 schematically shows the circuit arrangement of a signal amplifier circuit according to still another embodiment of the invention.

FIG. 5 shows a signal amplifier circuit according to still another embodiment of this invention wherein the predriver circuit 30 consists of a differential amplifier. The parts of FIG. 5 the same as those of FIG. 3 are denoted by the same numerals, description thereof being omitted. In the predriver circuit 30 of FIG. 5, the source electrodes of p-channel type field effect transistors $Q_7$, $Q_8$ are connected to the positive terminal of the power source $V_1$ through a current source I. The drain electrodes of differential transistors $Q_7$, $Q_8$ are connected to the point E through corresponding load resistors $R_7$, $R_8$. The drain electrode of the transistor $Q_7$ is directly connected to the gate electrode of the driver transistor $Q_3$. Since the field effect transistors $Q_7$, $Q_8$ are connected in a differential configuration, the predriver circuit 30 of FIG. 5 is immune from voltage variation at the point E. It will be evident that where the predriver circuit 30 consists of a differential amplifier comprised of current unsaturated type field effect transistors, the predriver input stage can be easily coupled directly to the driver circuit 20. In this invention, however, the differential predriver transistors are not limited to current unsaturated type field effect transistors, but may consist of conventional field effect transistors or bipolar transistors.

Resistors in the signal amplifier circuit of this invention need not be resistor elements, but may be replaced by other active or passive elements which have electrical resistivity.

What is claimed is:
1. A signal amplifier circuit comprising:
   a pushpull output circuit means having input and output means;
   direct-current voltage-supplying means connected to said pushpull output circuit means;
   a driver circuit means including a driver field effect transistor having gate, drain and source electrodes and current unsaturated triode vacuum tube characteristics, a first resistive impedance means coupled to said drain electrode, a second resistive impedance means coupled between said first resistive impedance means and said direct-current voltage-supplying means, a third resistive impedance means coupled between said source electrode and said direct-current voltage-supplying means, and means direct-current conductively connecting said drain electrode to said input means of said pushpull output circuit means;
   a predriver circuit means for applying a driver input signal between said gate electrode and said source electrode of said driver field effect transistor;
   said predriver circuit means includes a predriver field effect transistor having gate, drain and source electrodes and current unsaturated triode vacuum tube characteristics; a fourth resistive impedance means coupled between said source electrode of said driver field effect transistor and said drain electrode of said predriver field effect transistor; a fifth resistive impedance means coupled between said source electrode of said predriver field effect transistor and said direct-current voltage-supplying means; a sixth resistive impedance means coupled between said source electrode of said predriver field effect transistor and said source electrode of said driver field effect transistor; and means direct-current conductively connecting said drain electrode of said predriver field effect transistor to said gate electrode of said driver field effect transistor; and coupling means for coupling said output means of said pushpull output circuit means to a first point between said first resistive impedance means and said second resistive impedance means and a second point between said source electrode of said driver field effective transistor and said third resistive impedance means.

2. A signal amplifier circuit according to claim 1 wherein said coupling means include capacitor means.

3. A signal amplifier circuit according to claim 1 wherein the resistance value of said sixth resistive impedance means substantially equals the resistance value of said fifth resistive impedance means multiplied by the amplification factor of said predriver field effect transistor.

4. A signal amplifier circuit comprising;
a first field effect transistor of one channel type having a gate electrode, drain electrode and source electrode and current unsaturated triode vacuum tube characteristics;
a second field effect transistor of the other channel type having a gate electrode, drain electrode and source electrode and current unsaturated triode vacuum tube characteristics;
means for coupling said source electrodes of said first and second field effect transistors to an output point;
direct-current voltage supplying means coupled to said drain electrodes of said first and second field effect transistors;
a third field effect transistor of said other channel type having a gate electrode, drain electrode and source electrode and current unsaturated triode vacuum tube characteristics;
a first resistive impedance means coupled to said drain electrode of said third field effect transistor;
a second resistive impedance means coupled between said first resistive impedance means and said direct-current voltage supplying means;

a third resistive impedance means coupled between said source electrode of said third field effect transistor and said direct-current voltage supplying means;
means direct-current conductively connecting said drain electrode of said third field effect transistor to said gate electrodes of said first and second field effect transistors;
a first capacitor for coupling a first point between said first and second resistive impedance means to said output point; a second capacitor for coupling a second point between said source electrode of said third field effect transistor and said third resistive impedance means to said output point; and
means for applying an input signal between said gate electrode and said source electrode of said third field effect transistor.

5. A signal amplifier circuit according to claim 4 wherein last-mentioned means includes a fourth field effect transistor of said one channel type having a gate electrode, drain electrode and source electrode and current unsaturated triode vacuum tube characteristics; a fourth resistive impedance means coupled between said drain electrode of said fourth field effect transistor and said source electrode of said third field effect transistor; a fifth resistive impedance means coupled between said source electrode of said fourth field effect transistor and said direct-current voltage supply means; a sixth resistive impedance means coupled between said source electrode of said third field effect transistor and said source electrode of said fourth field effect transistor; and means direct-current conductively connecting said drain electrode of said fourth field effect transistor to said gate electrode of said third field effect transistor.

6. A signal amplifier circuit according to claim 5 wherein the resistance value of said sixth resistive impedance means substantially equals the resistance value of said fifth resistive impedance means multiplied by the amplification factor of said fourth field effect transistor.

7. A signal amplifier circuit according to claim 4 further comprising means connected between said drain electrode of said third field effect transistor and said first resistive impedance means to provide a predetermined voltage between said gate electrodes of said first and second field effect transistors.

8. A signal amplifier circuit according to claim 4 further comprising means connected between said source electrode of said third field effect transistor and said third resistive impedance means to provide a bias voltage between said gate electrode and source electrode of said third field effect transistor.

* * * * *